(«12») United States Patent
Oyama et al.

(10) Patent No.: US 8,289,708 B2
(45) Date of Patent: Oct. 16, 2012

(54) ELECTRIC EQUIPMENT

(75) Inventors: Hidetoshi Oyama, Osaka (JP); Kei Aimi, Osaka (JP)

(73) Assignee: Panasonic Corporation, Osaka (JP)

( * ) Notice: Subject to any disclaimer, the term of this patent is extended or adjusted under 35 U.S.C. 154(b) by 416 days.

(21) Appl. No.: 12/667,293

(22) PCT Filed: Feb. 2, 2009

(86) PCT No.: PCT/JP2009/000375
§ 371 (c)(1),
(2), (4) Date: Dec. 30, 2009

(87) PCT Pub. No.: WO2009/098854
PCT Pub. Date: Aug. 13, 2009

(65) Prior Publication Data
US 2010/0328884 A1    Dec. 30, 2010

(30) Foreign Application Priority Data

Feb. 6, 2008   (JP) ................. 2008-026179

(51) Int. Cl.
*H05K 7/20* (2006.01)
(52) U.S. Cl. ............. 361/692; 361/679.49; 361/679.5; 361/679.51; 361/697; 454/184; 454/186
(58) Field of Classification Search .......... 361/692; 219/76.11
See application file for complete search history.

(56) References Cited

U.S. PATENT DOCUMENTS

| | | | | |
|---|---|---|---|---|
| 3,187,082 A * | 6/1965 | Allison | ................ | 174/395 |
| 4,399,485 A * | 8/1983 | Wright et al. | ................ | 361/693 |
| 4,628,992 A * | 12/1986 | Kennedy | ................ | 165/123 |
| 5,424,915 A * | 6/1995 | Katooka et al. | ................ | 361/695 |
| 6,053,808 A * | 4/2000 | Koradia et al. | ................ | 454/184 |
| 6,088,225 A * | 7/2000 | Parry et al. | ................ | 361/704 |
| 6,094,345 A * | 7/2000 | Diemunsch | ................ | 361/695 |
| 6,459,577 B1 * | 10/2002 | Holmes et al. | ................ | 361/690 |
| 6,515,859 B2 * | 2/2003 | Roberts et al. | ................ | 361/695 |
| 6,542,361 B2 * | 4/2003 | Paradis | ................ | 361/679.47 |
| 7,180,740 B2 * | 2/2007 | Li et al. | ................ | 361/697 |
| 7,589,978 B1 * | 9/2009 | Holdredge et al. | ................ | 361/818 |

(Continued)

FOREIGN PATENT DOCUMENTS

JP    52-22556    2/1977

(Continued)

OTHER PUBLICATIONS

Supplemental European Search Report, issued May 30, 2011 in EP Application 09 70 7739.0, which is a counterpart to the present application.

(Continued)

*Primary Examiner* — Anthony Q Edwards
(74) *Attorney, Agent, or Firm* — Wenderoth, Lind & Ponack, LLP.

(57) ABSTRACT

An electric device includes: first opening 7 provided on rear panel 4 to exhaust internal air out of casing 1; first partition 12 covering second opening 8 provided on left side panel 2 and having fourth opening 10; second partition 13 covering third opening 9 provided on right side panel 3 and having fifth opening 11; and radiator 14 disposed so as for opening 14C at one end to face opening 7. The configuration can prevent weld spatters or the like from coming into casing 1 directly.

10 Claims, 5 Drawing Sheets

U.S. PATENT DOCUMENTS

| | | | |
|---|---|---|---|
| 8,059,401 B2 * | 11/2011 | Guan | 361/692 |
| 2001/0005309 A1 * | 6/2001 | Iwasaki | 361/695 |
| 2003/0117772 A1 * | 6/2003 | Searls et al. | 361/690 |
| 2007/0034617 A1 | 2/2007 | Oyama et al. | |
| 2009/0059520 A1 * | 3/2009 | Tanaka et al. | 361/692 |
| 2009/0310301 A1 * | 12/2009 | Nelson et al. | 361/695 |
| 2010/0172092 A1 * | 7/2010 | Davis et al. | 361/692 |

FOREIGN PATENT DOCUMENTS

| | | |
|---|---|---|
| JP | 54-137826 | 9/1979 |
| JP | 4-30787 | 3/1992 |
| JP | 6-41315 | 5/1994 |
| JP | 8-214549 | 8/1996 |
| JP | 08-214549 | 8/1996 |
| JP | 1129515 | 12/2001 |
| JP | D 1129515 | 12/2001 |
| JP | 2006-156430 | 6/2006 |

OTHER PUBLICATIONS

International Search Report issued Apr. 14, 2009 in International (PCT) Application No. PCT/JP2009/000375.

Partial English translation of JP 2006-156430, Jun. 2006.

* cited by examiner

ELECTRIC EQUIPMENT

TECHNICAL FIELD

The present invention relates to an electric divce such as for instance a welding divce or the like that has an interior cooled by a fan.

BACKGROUND ART

A conventional electric divce such as a welding divce has been known that has a casing provided with an intake vent and an exhaust vent for cooling inside the divce by a fan (see for instance Unexamined Japanese Patent Publication No. H8-214549). Additionally, a welding divce has been known that has a casing provided with openings on either right-and-left or front-and-rear side panels for cooling the divce (see for instance Japanese Registered Design Publication No. 1129515).

An electric divce shown in FIG. 5 is what is thought out to have a better cooling capability than conventional art.

The electric device shown in FIG. 5 has casing 40 with front panel 31, left side panel 32, right side panel 33 and rear panel 34. Rear panel 34 has first opening 37 to exhaust internal hot air out of casing 40. Left side panel 32 has second opening 38 to take air into casing 40 from outside. Right side panel 33 has third opening 39 to take air into casing 40 from outside. Heating element 15 is disposed inside casing 40. Fan 36 is provided inside casing 40 to exhaust internal hot air out of casing 40.

However, an electric divce such as a welding device or the like such as the aforementioned conventional electic device is at risk of having heated spatters in a welding operation or red-hot iron powder in grinding operation or the like enter directly into the electric device from the openings. Even if louvers were provided in front of openings 37 to 39, some red-hot in material would enter at some spattering angles.

SUMMARY OF THE INVENTION

The present invention is to provide an electric divce with a high safety performance that can prevent hot weld spatters or the like from coming into the divce directly if they enter into the divce from openings.

The electric divce includes: a casing having a front panel, a right side panel, a left side panel, a rear panel, a top panel and a bottom panel; an exhaust opening provided on either the front panel, the right side panel, the left side panel, the rear panel, the top panel or the bottom panel to exhaust internal hot air out of the casing; an intake opening provided on at least one of the panels where the exhaust opening is not provided inside the casing from outside; a partition provided inside the casing so as to form an air path with the panel on which the intake opening is provided and having another intake opening; formed in a position so as not to overlap the first intake opening; a radiator with an enclosure forming a hollow for air-flow and disposed between the partition and the panel on which the exhaust opening is formed so that one open end of the hollow face the exhaust opening; a heating element disposed in the casing; and a fan to exhaust internal hot air out of the casing.

If, for instance, weld spatters or the like occurred in welding operation come into the electric divce from the openings, the configuration will stop the spatters once at the partition. The configuration can, therefore, prevent the weld spatters or the like from coming directly into the electric divce having electronic components or the like, so that an electric divce with high safety performance is obtainable.

DETAILED DESCRIPTION OF THE INVETION (Exemplary Embodiment 1)

Figure 1:
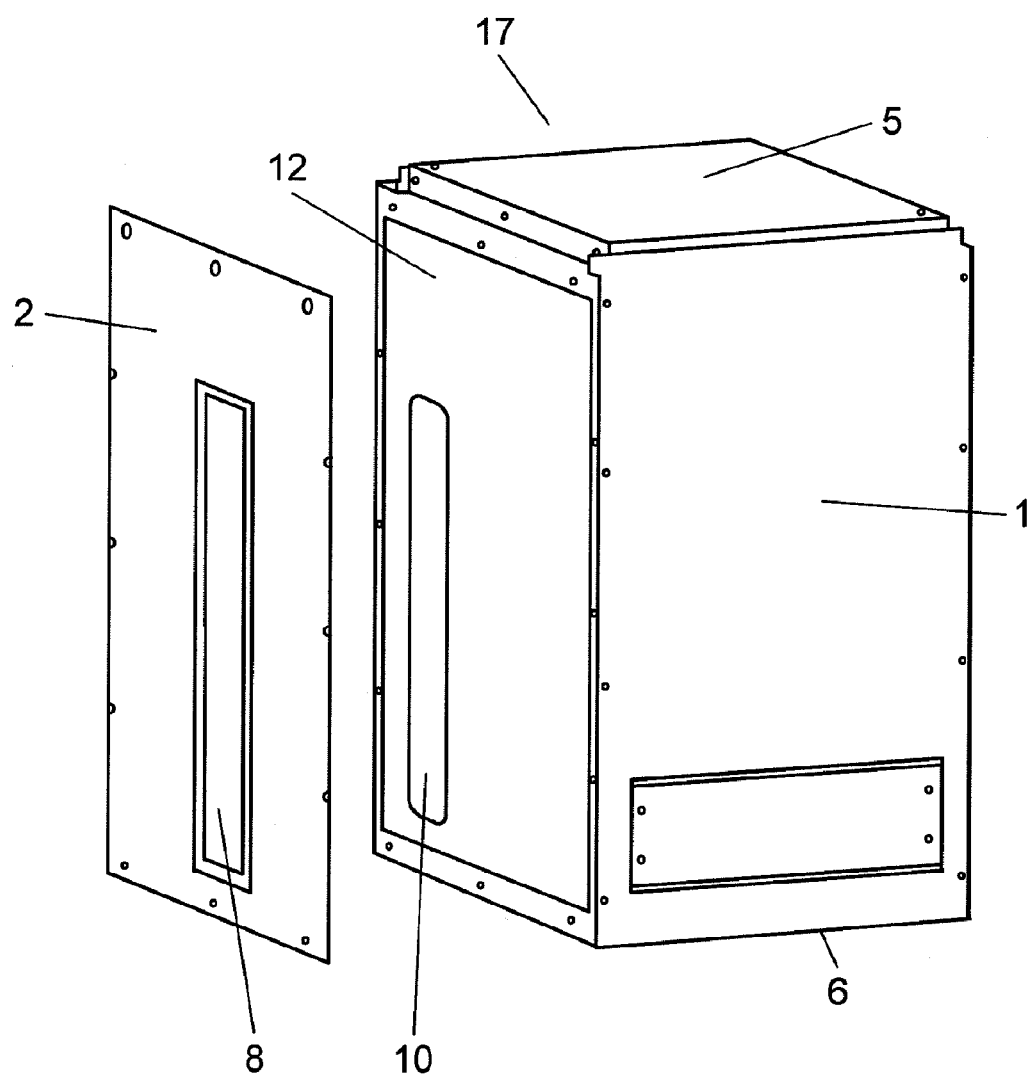
FIG. 1 shows a schematic view of an appearance of an electric divce in accordance with an embodiment of the present invention.
Figure 2:
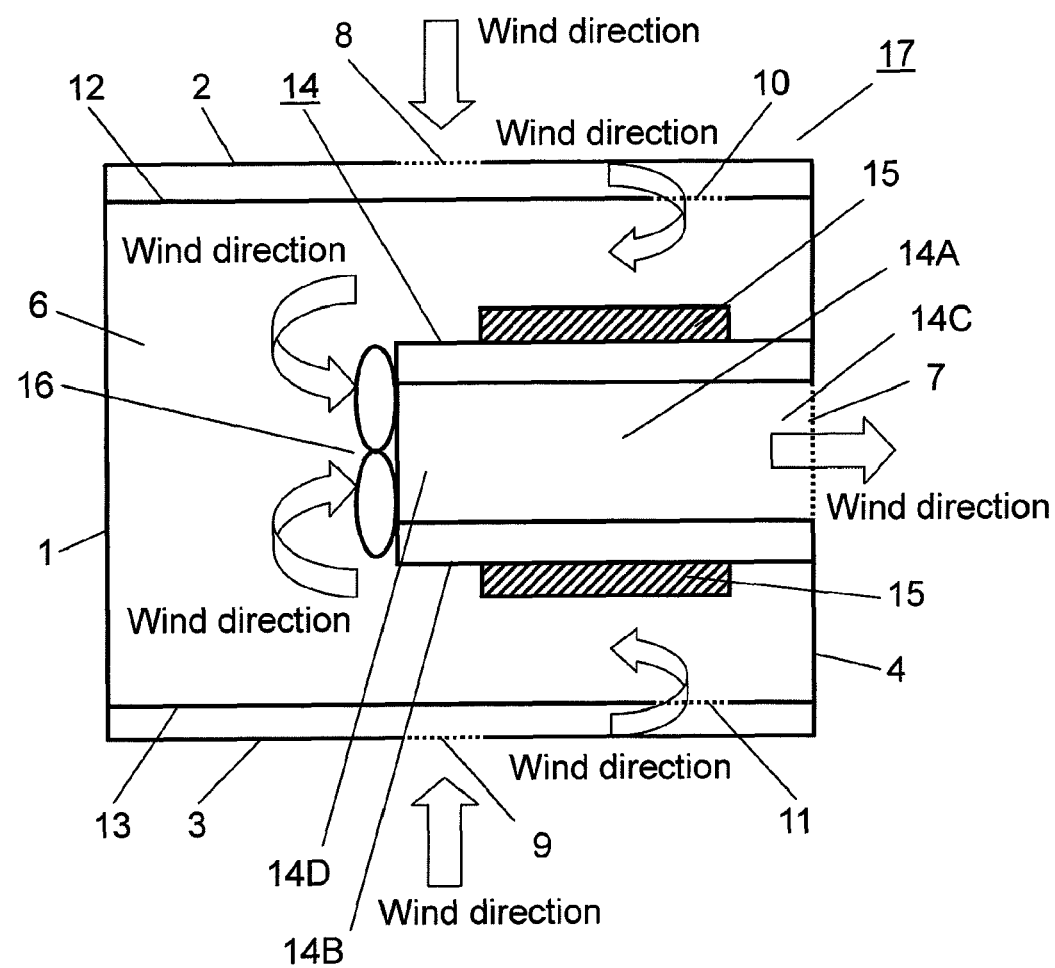
FIG. 2 shows a sectional top view of a schematic structure of the electric divce in accordance with an embodiment of the present invention.
Figure 3:
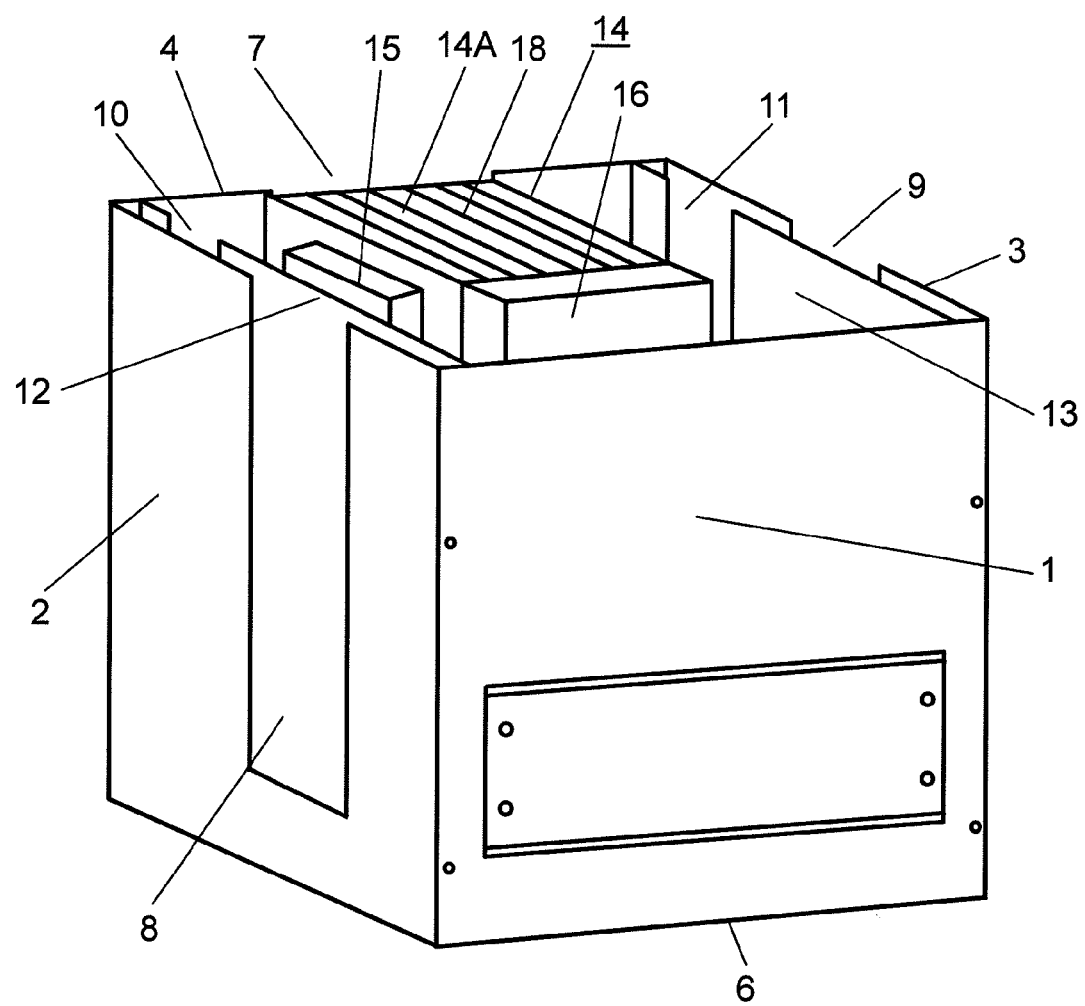
FIG. 3 shows a perspective top view of a schematic structure of the electric divce in accordance with an embodiment of the present invention.

An exemplary embodiment of the present invention is described hereinafter with reference to FIGS. 1 to 3. FIG. 1 shows a schematic view of an appearance of welding divce as an example of the electric divce in accordance with embodiment 1 of the present invention. Left side panel 2 described later is shown detached to understand the structure easily. FIG. 2 shows a schematic sectional top view of a structure of the electric divce in accordance with embodiment 1 of the present invention. FIG. 3 shows a schematic sectional view of an essential part of the electric divce in accordance with the embodiment 1 of the present invention. FIG. 3 shows a schematic sectional view of an essential part of the electric device in accordance with the embodiment when cut in about half in heighth and viewed from an oblique direction.

In FIGS. 1 to 3, casing 17 includes front panel 1, left side panel 2, right side panel 3, rear panel 4, top panel 5 and bottom panel 6. When casing 17 is placed on a base surface with front panel 1 perpendicularly to the base surface, two panels perpendicular to the base surface and next to front panel 1 shall be left side panel 2 and right side panel 3 respectively, and a panel perpendicular to the base surface and facing front panel 1 shall be rear panel 4. A panel that is generally parallel to (hereafter "generally parallel" is referred also as to "parallel") the base surface and next to front panel 1, left side panel 2, right side panel 3 and rear panel 4 shall be top panel 5. A panel generally parallel to the base surface and next to front panel 1, left side panel 2, right side panel 3 and rear panel 4, facing top panel 5 and closer to the base surface than top panel 5 shall be bottom panel 6.

Rear panel 4 has first opening 7 (exhaust opening) to exhaust internal air out of casing 17. Left side panel 2 has second opening 8 (intake opening) to take air into casing 17. The center of second opening 8 is located on generally the same (hereafter "generally the same" is referred to "the same") position as the center of left side panel 2 laterally. Right side panel 3 also has third opening 9 (intake opening) to take air into casing 17. The center of third opening 9 is located on generally the same position as the center of right side panel 3 laterally.

First partition 12 generally parallel to left side panel 2 and contacting top panel 5, bottom panel 6, front panel 1 and rear panel 4 is provided inside casing 17. First partition 12 has fourth opening 4 (another intake opening) to send intake air from second opening 8 into casing 17. In addition to this, second partition 13 generally parallel to right side panel 3 and contacting top panel 5, bottom panel 6, front panel 1 and rear panel 4 is provided inside casing 17. Second partition 13 has fifth opening 11 (another intake opening) to send intake air from third opening 9 into casing 17.

Fourth opening 10 is located on the side of rear panel 4 so as not to overlap second opening 8 laterally. Similarly, fifth opening 11 is located on the side of (i.e., closer to) rear panel 4 so as not to overlap third opening 9 laterally. As described above, the center of fourth opening is located on the side of (i.e., closer to) rear panel 4 away from the center of first partition 12 laterally. The center of fifth opening 11 is located on the side of (i.e., closer to) rear panel 4 away from the center of second partition 13 laterally. Second opening 8 is located on the side of front panel 1 away from fourth opening 10 laterally, (i.e., closer than fourth opening 10 to front panel 1) and third opening 9 is located on the side of front panel 1 away from fifth opening 11 laterally. (i.e., closer than fith opening 11 to front panel 1). That is, first partition 12 is provided generally parallel to left side panel 2 in casing 17 so as to cover second opening 8. Similarly, second partition 13 is provided generally parallel to right side panel 3 in casing 17 so as to cover third opening 9. Radiator 14 is disposed between first partition 12 and second partition 13.

Radiator 14 has a tunnel-shaped enclosure 14B with hollow 14A for inside airflow. Hollow 14A is formed like a rectangular cylinder with two-tiered structure in this embodiment. Hollow 14A can be one-tiered or more than three-tiered. Radiator 14 is disposed such that opening 14C at one end faces first opening 7 of rear panel 4. Heating element 15 is attached on the outer surface of radiator 14. Heating element 15 is for instance an electronic component such as semi-conductor element to act as a switching element or the like that perform inverter controlling on the output of a welding divce. Whenever the welding divce operates, the switching element or the like turns on, thereby emitting heat energy. Heating element 15 working as a heat source, therefore, heat up inside casing 17 eventually. A power transistor or the like other than switching element can be heating element 15. Heating element 15 may be disposed in a position a distance away from radiator 14. Fin-like heat sinks 18 shown in FIG. 3 are provided inside hollow 14A to radiate internal heat emission effectively.

Fan 16 is provided on opening 14D opposite to opening 14C of radiator 14 as a blower to exhaust internal hot air out of casing 17. Fan 16 can be provided: on opening 14C of radiator 14; on both openings 14C and 14D of radiator 14 respectively; or inside radiator 14. Fan 16 can be provided: at second opening 8 and third opening 9; on fourth opening 10 and fifth opening 11; or on second opening 8, third opening 9, fourth opening 10 and fifth opening 11. Fan 16 can be provided on any combination of the openings. Moreover, fan 16 can be provided on each of two-tiered hollows 14A. That is, fan can be provided on any position if internal air can be exhausted out of casing 17 from opening 7 through radiator 14.

A cooling operation of the electric divce having the aforementioned configuration is described next using a welding divce as an example. When an ignition switch (not shown) turns on, the electric divce starts operation and heating elements 15 begins to work and to radiate heat emission. When the ignition switch turns on, therefore, fan 16 starts running to cool down the interior of casing 17. Or, fan 16 starts running automatically when the atmosphere inside casing 17 reaches a predetermined temperature after the ignition switch has turned on. When fan 16 is running, air is taken from second opening 8 into casing 17, and the intake air is then sent further inside through fourth opening 10 located on the side nearer to rear panel 4 than second opening 8. The intake air flows from the side of rear panel 4 to the side of front panel 1 and is exhausted out of casing 17 from first opening 7 through radiator 14. Similarly, when fan 16 is running, air is taken from third opening 9 into casing 17, and the intake air is then sent further inside through fifth opening 11 located on the side nearer to rear panel 4 than third opening 9. The intake air flows from the side of rear panel 4 to the side of front panel 1 and is exhausted out of casing 17 from first opening 7 through radiator 14.

In this embodiment, the center of fourth opening 10 is located on the side of rear panel 4 away from the center of first partition 12 laterally, and the center of fifth opening 11 is located on the same side away from the center of second partition 13 laterally. However, the center of fourth opening 10 can be located on the same position as the center of first partition 12, and the center of fifth opening 11 can be located on the same position as the center of second partition 13. Even in such a case, the same airflow as described in the above would occur inside casing 17 if second opening 8 is formed on the side of front panel 1 away from opening 10 laterally and third opening 9 away from opening 11 laterally respectively.

The configuration can thus cool down inside casing 17. Intake air flows from the side of rear panel 4 to the side of front panel 1 and further to the side of rear panel 4 through inside of radiator 14. Therefore, the airflow can cool not only radiator 14 but also the surfaces of heating element 15 and can cool casing 17 effectively since the airflow covers inside of casing 17 entirely.

In welding operation, fan 16 is running to take air into casing 17 but at the same time hot weld spatters or the like would possibly be taken into casing 17 from second opening 8 or third opening 9. However, even if hot weld spatters or the like come into casing 17 from second opening 8, they would only hit first partition 12 as fourth opening 10 is provided on a position not to overlap the position of second opening 8. Similarly, even if hot weld spatters or the like come into casing 17 from third opening 9, they would only hit second partition 13 as fifth opening 11 is provided on a position not to overlap the position of third opening 9. The configuration, therefore, can prevent weld spatters or the like from coming into the electric divce having heating element 15, or electronic components, so that safety of the electric divce is maintained.

As described above, the electric divce of this embodiment can improve cooling efficacy for inside casing 17 and can prevent hot weld spatters or the like from coming into casing 17 to keep the safety of electric divce.

In the above-described electric divce, radiator 14 can be attached with a different heating element 15 for each hollow 14A individually to exhaust heat emitted from heating element 15, a heat source, effectively. In this case as described above, fan 16 should preferably be set for each hollow 14A.

A structure of second opening 8 with about the same height as left side panel 2 and third opening 9 with about the same height as right side panel 3 will be able to take a more amount of air into casing 17 with each opening width remains unchanged.

A structure of first partition 12 contacting top panel 5, bottom panel 6 and front panel 1 but not contacting rear panel 4 will produce a gap between first partition 12 and rear panel 4, which can be used as fourth opening 10. Similarly, another structure of second partition 13 contacting top panel 5, bottom panel 6 and front panel 1 but not contacting rear panel 4 will produce a gap between second partition 13 and rear panel 4, which can be used as fifth opening 11.

Additionally, in this embodiment, second opening 8 is provided on the side of front panel 1 away from fourth opening 10 laterally and third opening 9 on the side of front panel 1 away from fifth opening 11 laterally respectively. If, however, fourth opening 10 is provided on the side of front panel 1 away from second opening 8 laterally and fifth opening 11 on the side of front panel 1 away from third opening 9 laterally respectively, first partition 12 will cover second opening 8 and second partition 13 third opening 9 respectively. Therefore, the configuration can cool inside casing 17 effectively and can prevent hot weld spatters or the like from coming into casing 17, so that safety of the electric divce is maintained. In this case, if heating element 15 is disposed in the airflow inside casing 17, heat emission from heating elements 15 can be exhausted effectively.

Figure 4:
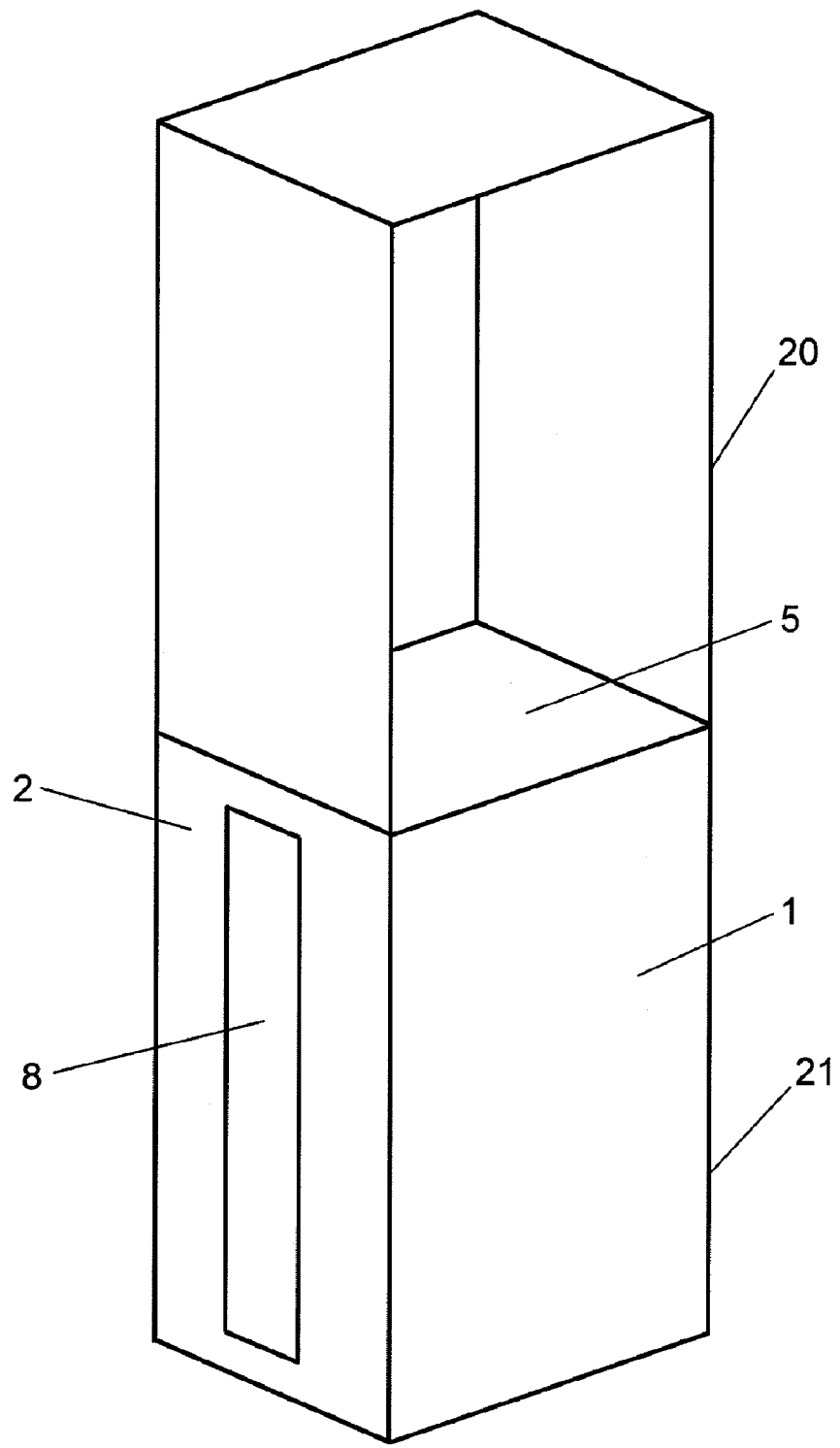
FIG. 4 shows a partial transparent perspective view of another example of the electric divce in accordance with an embodiment of the present invention.
Figure 5:
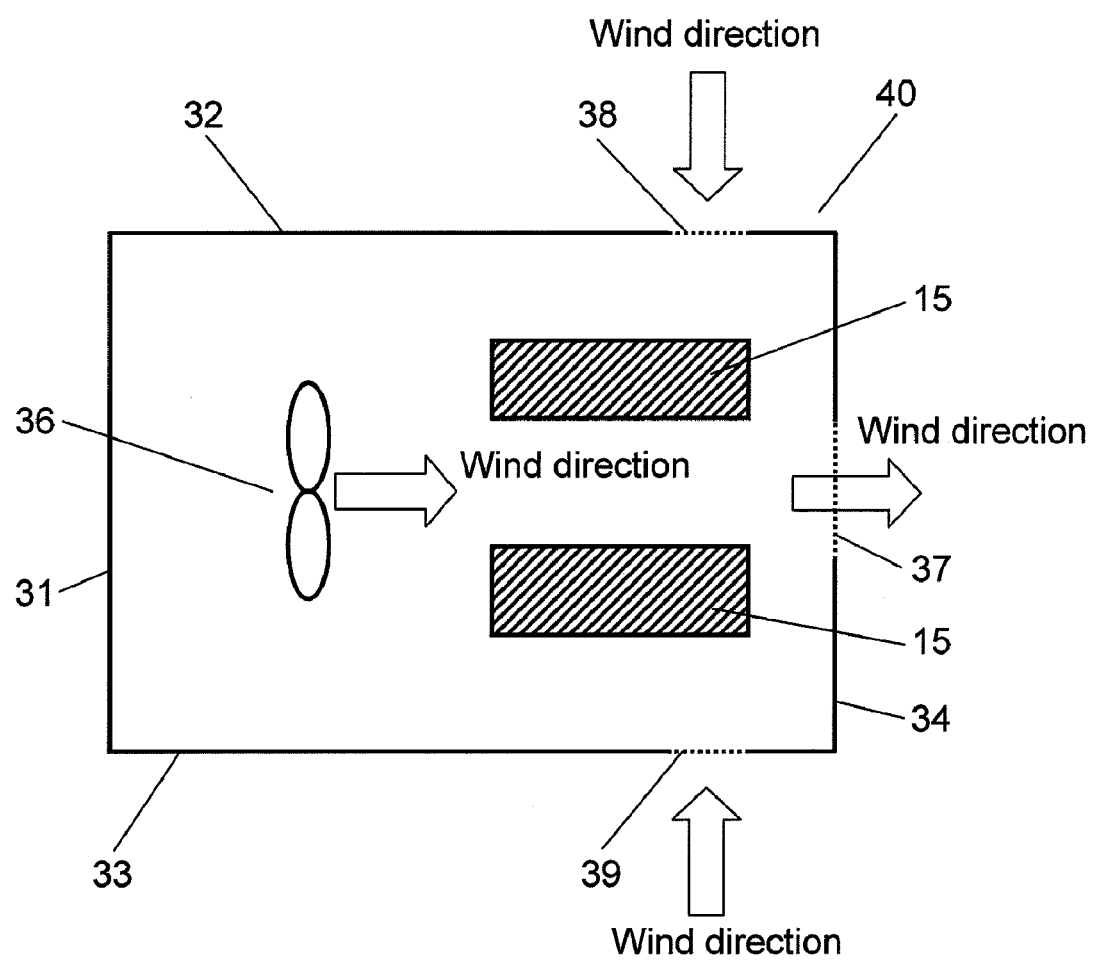
FIG. 5 shows a schematic view of a structure of conventional welding divce.

FIG. 4 shows a partially transparent perspective view of the other example of the electric divce of this embodiment. The electric divce shown in FIG. 4 is for instance divided into two top-and-bottom spaces by top panel 5. The space upper from top panel 5 is a perfect dust-free space 20. The space lower from and including top panel 5 is cooled space 21 with the structure of casing 17 described above. The electric divce can be structured to have dust-free space 20 and cooled space 21 like this example.

Realizing improved internal safety performance, the electric divce is useful in the field of divce cooled by fan such as welding divce or the like, especially useful for electric divce used in a working environment where spatters exist.

The invention claimed is:

1. An electric device comprising:
 a casing having a front panel, a left side panel, a right side panel, a rear panel, a top panel and a bottom panel;
 an exhaust opening provided in one of the front panel, the left side panel, the right side panel, the rear panel, the top panel and the bottom panel to exhaust air inside the casing out of the casing;
 a panel intake opening provided in at least one of the panels, in which no exhaust opening is provided, to take the air into the casing from outside the casing;
 a partition provided in the casing so as to form an air path with the panel in which the intake opening is provided, and the partition is provided with a partition intake opening at a position which does not overlap with the panel intake opening to take the air into the casing;
 a radiator having an enclosure forming a hollow to allow flow of the air and disposed between the partition and the panel in which the exhaust opening is provided so that an opening at an end of the hollow faces the exhaust opening;
 a heating element disposed inside the casing; and
 a fan to exhaust the air heated inside the casing out of the casing.

2. The electric device according to claim 1, wherein
 the exhaust opening is a first opening provided in the rear panel;
 the panel intake opening is one of a plurality of panel intake openings including a second opening provided in the left side panel and a third opening provided in the right side panel;
 the partition is one of a plurality of partitions including a first partition provided inside the casing so as to form the air path with the left side panel and a second partition provided inside the casing so as to form an air path with the right side panel;
 the partition intake opening is one of a pularity of partition intake openings including a fourth opening provided in the first partition at a position so as not to overlap the second opening, and a fifth opening provided in the second partition at a position so as not to overlap the third opening; and
 the radiator is disposed between the first partition and the second partition.

3. The electric device according to claim 2, wherein the fourth opening is located so as to be disposed between the rear panel and the second opening.

4. The electric device according to claim 2, wherein the fifth opening is located so as to be disposed between the rear panel and the second opening.

5. The electric device according to claim 2, wherein
 the first partition is parallel to the left side panel and contacts the top panel, the bottom panel, the front panel and the rear panel, and a center of the fourth opening is disposed at or rearward of a center of the first partition;
 the second partition is parallel to the right side panel and contacts the top panel, the bottom panel, the front panel and the rear panel, and a center of the fifth opening is disposed at or rearward of a center of the second partition;
 the second opening is located as so to be disposed between the front panel and the fourth opening; and
 the third opening is located so as to be disposed between the front panel and the fifth opening.

6. The electric device according to claim 2, wherein
 the second opening is equal to the left side panel in height and the third opening is equal to the right side panel in height.

7. The electric device according to claim 2, wherein
 the first partition is parallel to the left side panel and contacts the top panel, the bottom panel and the front panel, and the fourth opening is formed between the second opening and the rear panel; and
 the second partition is parallel to the right side panel and contacts the top panel, the bottom panel and the front panel, and the fifth opening is formed between the third opening and the rear panel.

8. The electric device according to claim 1, wherein
 the heating element is one of a plurality of heating elements, and the heating elements are disposed on the outer surface of the radiator.

9. The electric device according to claim 1, wherein
 the hollow is one of a plurality of hollows of the radiator.

10. The electric device according to claim 1, further comprising
 a fan at an opening at one end of the hollow.

\* \* \* \* \*

UNITED STATES PATENT AND TRADEMARK OFFICE
CERTIFICATE OF CORRECTION

PATENT NO. : 8,289,708 B2
APPLICATION NO. : 12/667293
DATED : October 16, 2012
INVENTOR(S) : Hidetoshi Oyama It is certified that error appears in the above-identified patent and that said Letters Patent is hereby corrected as shown below:

ON THE FRONT PAGE

In section (57) Abstract, lines 6 and 7, "opening 11; and radiator 14 disposed so as for opening 14C at one end to faceopening 7. The configuration can prevent weld" should read -- opening 11; and radiator 14 disposed so that opening 14C at one end faces opening 7. The configuration can prevent weld --.

Signed and Sealed this
Twenty-sixth Day of February, 2013

Teresa Stanek Rea
*Acting Director of the United States Patent and Trademark Office*